(12) United States Patent
Yamagami

(10) Patent No.: US 8,059,855 B2
(45) Date of Patent: Nov. 15, 2011

(54) SPEAKER DEVICE AND TELEVISION SET

(75) Inventor: Susumu Yamagami, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 549 days.

(21) Appl. No.: 12/356,628

(22) Filed: Jan. 21, 2009

(65) Prior Publication Data

US 2009/0190790 A1     Jul. 30, 2009

(30) Foreign Application Priority Data

Jan. 24, 2008   (JP) .................................. 2008-013238

(51) Int. Cl.
*H04R 1/02* (2006.01)

(52) U.S. Cl. ........ 381/386; 381/388; 381/394; 381/409; 181/199; 439/570; 439/708; 361/679.44; 455/90.3; 455/575.1

(58) Field of Classification Search .......... 381/386–388, 381/394–395, 411; 455/409, 575.1, 90.3; 361/679.43–44; 29/594; 439/573, 569–570, 439/708–709; 181/198–199
See application file for complete search history.

(56) References Cited

U.S. PATENT DOCUMENTS

| | | | | |
|---|---|---|---|---|
| 3,609,652 A | * | 9/1971 | Sebastian | 439/709 |
| 4,343,084 A | * | 8/1982 | Wilmarth | 29/843 |
| 4,465,905 A | * | 8/1984 | Nation | 381/386 |
| 4,966,558 A | * | 10/1990 | Moriyama | 439/573 |
| 5,757,945 A | * | 5/1998 | Sakamoto | 381/400 |
| 2003/0026445 A1 | * | 2/2003 | Anderson | 381/386 |

FOREIGN PATENT DOCUMENTS

| | | |
|---|---|---|
| JP | 3011621 U | 3/1995 |
| JP | 10-178698 A | 6/1998 |
| JP | 3126686 U | 10/2006 |

* cited by examiner

*Primary Examiner* — Michael Trinh
(74) *Attorney, Agent, or Firm* — Global IP Counselors

(57) ABSTRACT

A speaker device includes a speaker and a connecting component. The speaker has a pair of input terminals spaced apart with a first predetermined distance therebetween. The connecting component electrically couples the speaker to a printed circuit board. The connecting component has a relay-use printed circuit board and a pair of lead wires. The relay-use printed circuit includes a pair of sub-board portions and a separation portion. The sub-board portions have a pair of terminal holes. The input terminals of the speaker are disposed through the terminal holes, respectively. The separation portion is disposed between the sub-board portions to couple the sub-board portions with a second predetermined distance between the terminal holes of the sub-board portions, and selectively separate the sub-board portions when the first predetermined distance between the input terminals of the speaker is different from the second predetermined distance between the terminal holes of the sub-board portions.

10 Claims, 7 Drawing Sheets

SPEAKER DEVICE AND TELEVISION SET

CROSS-REFERENCE TO RELATED APPLICATIONS

This application claims priority to Japanese Patent Application No. 2008-013238 filed on Jan. 24, 2008. The entire disclosure of Japanese Patent Application No. 2008-013238 is hereby incorporated herein by reference.

BACKGROUND OF THE INVENTION

1. Field of the Invention

The present invention generally relates to a speaker device and a television set having the speaker device. More specifically, the present invention relates to a speaker device with a relay-use printed circuit board connecting between an input terminal component and a printed circuit board.

2. Background Information

A conventional speaker device is used in a liquid crystal television set or the like. The speaker device outputs sound based on an output signal from a television reception component. A printed circuit board mounted in the television reception component and an input terminal component of the speaker device are connected directly by a lead wire (see Japanese Utility Model Registration No. 3,011,621, for example). Also, with another conventional speaker device, a spring connector is provided to a speaker instead of a lead wire, and presses against a conductor of a printed board (see Japanese Utility Model Registration No. 3,011,621, for example).

With another conventional speaker device, a connecting plate is provided to an input terminal of a speaker to connect the speaker and a printed circuit board. The connecting plate is connected with a spring member affixed to the printed circuit board (see Japanese Laid-Open Patent Application No. H10-178698, for example).

Further, there is a disclosure in which one or more disconnection grooves are formed in a printed circuit board. The printed circuit board is demarcated into one or more sub-boards having a main wiring pattern. A land for soldering surface mount chip parts is formed straddling the disconnection groove at the end of a conductive pattern of each sub-board facing the disconnection groove (see Japanese Utility Model Registration No. 3,126,686, for example).

However, with the constitution discussed in Japanese Utility Model Registration No. 3,011,621, the printed circuit board and the input terminal component are directly connected with the lead wire. Thus, the connection work is difficult during assembly. Also, with the constitution discussed in Japanese Utility Model Registration No. 3,011,621, the spring connector of the speaker is directly pressed against the conductor part of the printed circuit board. In the case of a television set, for example, the size of the speaker will vary according to the screen size. Thus, printed circuit boards have to be formed corresponding to speakers for each screen size, which creates a problem in terms of universality. With the constitution discussed in Japanese Laid-Open Patent Application No. H10-178698, the connecting plate provided to the input terminal of the speaker is connected to the spring member affixed to the printed circuit board. Thus, printed circuit boards have to be formed corresponding to speakers for each screen size, which creates a problem in terms of universality.

Furthermore, with the constitution discussed in Japanese Utility Model Registration No. 3,126,686, the printed circuit board whose size is varied is obtained so as to match the cabinet size or the available space at the attachment site. However, it is difficult to obtain a connecting component for transmitting audio signals to the speaker regardless of the speaker size. Furthermore, a connecting component having a relay-use printed circuit board is not used to connect the input terminal component of the speaker with a printed circuit board equipped with a function that outputs an audio signal to the input terminal component of the speaker.

In view of the above, it will be apparent to those skilled in the art from this disclosure that there exists a need for an improved speaker device and a television set. This invention addresses this need in the art as well as other needs, which will become apparent to those skilled in the art from this disclosure.

SUMMARY OF THE INVENTION

The present invention is conceived in light of the above-mentioned problems. One object of the present invention is to provide a speaker device with a relay-use printed circuit board for connecting an input terminal component and a printed circuit board, with which universality of the relay-use printed circuit board is improved and connection between the input terminal component and the printed circuit board is facilitated.

In accordance with one aspect of the present invention, a speaker device includes a speaker and a connecting component. The speaker has a pair of input terminals spaced apart with a first predetermined distance therebetween. The connecting component electrically couples the speaker to a printed circuit board that is configured to output an audio signal. The connecting component has a relay-use printed circuit board and a pair of lead wires. The relay-use printed circuit includes a pair of sub-board portions and a separation portion. The sub-board portions have a pair of terminal holes formed on the sub-board portions, respectively. The input terminals of the speaker are disposed through the terminal holes, respectively, to electrically couple the input terminals to the sub-board portions. The separation portion is disposed between the sub-board portions to couple the sub-board portions with a second predetermined distance between the terminal holes of the sub-board portions, and selectively separate the sub-board portions when the first predetermined distance between the input terminals of the speaker is different from the second predetermined distance between the terminal holes of the sub-board portions. The lead wires electrically couple the sub-board portions of the relay-use printed circuit board to the printed circuit board, respectively.

With the speaker device of the present invention, it is possible to provide a speaker device with a relay-use printed circuit board for connecting an input terminal component and a printed circuit board, with which universality of the relay-use printed circuit board is improved and connection between the input terminal component and the printed circuit board is facilitated.

These and other objects, features, aspects and advantages of the present invention will become apparent to those skilled in the art from the following detailed descriptions, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENT

A preferred embodiment of the present invention will now be explained with reference to the drawings. It will be apparent to those skilled in the art from this disclosure that the following description of the preferred embodiment of the present invention is provided for illustration only and not for the purpose of limiting the invention as defined by the appended claims and their equivalents.

Figure 1:
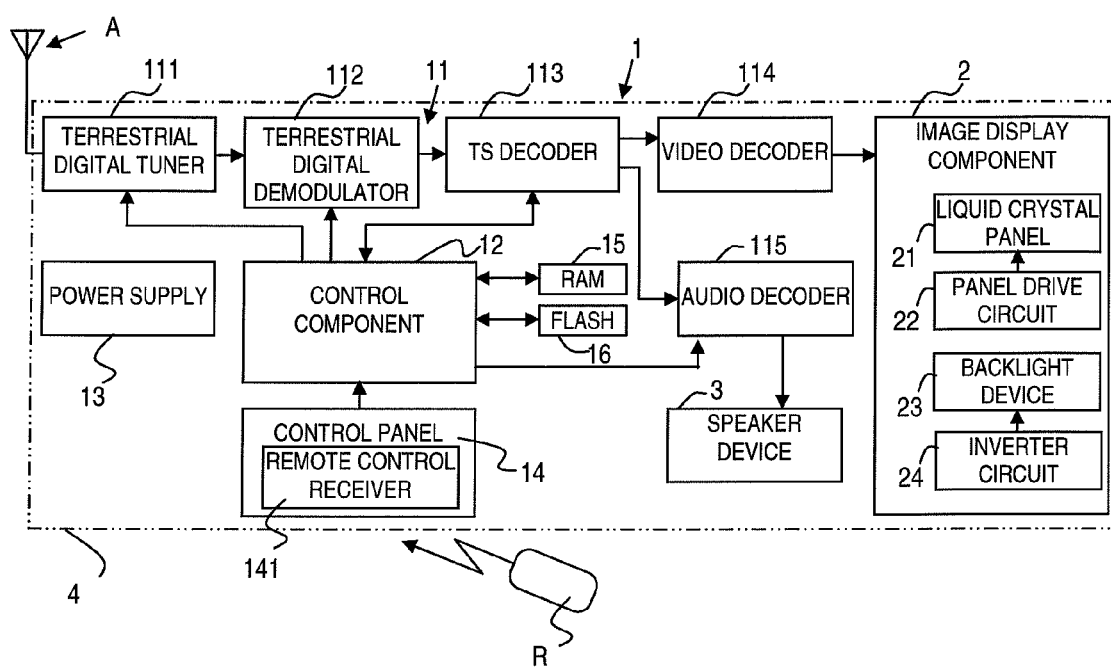
FIG. 1 is a block diagram of a liquid crystal television set having a speaker device in accordance with one embodiment of the present invention.

As shown in FIG. 1, a liquid crystal television set 1 receives terrestrial digital television broadcasts. The liquid crystal television set 1 includes a television reception component 11, an image display component 2, a pair of left and right speaker devices 3, a control component 12, a power supply 13, a control panel 14 and a cabinet 4. The image display component 2 has a liquid crystal display device, for example. The image display component 2 displays image information based on an output signal from the television reception component 11. Each of the speaker devices 3 has a speaker that outputs sound based on the output signal from the television reception component 11. The control component 12 performs overall control over the various components of the liquid crystal television set 1. The power supply 13 supplies electrical power to the various components. The cabinet 4 houses the television reception component 11, the image display component 2, the speaker devices 3, the control component 12, the power supply 13, and so forth. The television reception component 11, a panel drive circuit 22 and an inverter circuit 24 of the image display component 2, the control component 12, the power supply 13, and so forth are mounted on a main printed circuit board 5 produced separately from a printed circuit collection board P (see FIG. 9).

Figure 2:
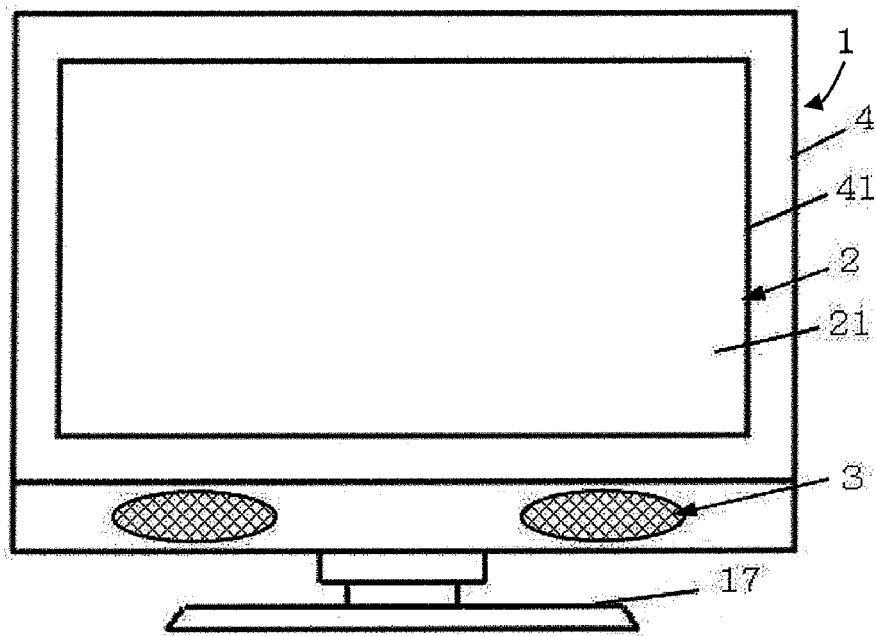
FIG. 2 is a front elevational view of the liquid crystal television set illustrated in FIG. 1.

The liquid crystal television set 1 has the cabinet 4. The cabinet 4 has a thin, substantially rectangular shape as shown in FIG. 2. The cabinet 4 is held substantially upright (vertical) by a stand mechanism 17 or the like. The cabinet 4 has a rectangular opening 41 provided on a front face of the cabinet 4. The image display component 2 has a liquid crystal panel 21 as a display screen. The liquid crystal panel 21 is a display means for displaying image information. The liquid crystal panel 21 is fitted into the opening 41 of the cabinet 4. Video and other images can be displayed on the liquid crystal panel 21. Also, the speaker devices 3 are disposed under the image display component 2. The cabinet 4 also serves as a cabinet for the speaker devices 3.

The television reception component 11 performs tuning of the broadcast signal of a channel set and inputted by the user from among the terrestrial digital broadcast signals received through an antenna A, demodulates the broadcast signal and outputs video and audio signals. The television reception component 11 includes a terrestrial digital tuner 111, a terrestrial digital demodulator 112, a TS (Transport Stream) decoder 113, a video decoder 114 and an audio decoder 115. The terrestrial digital tuner 111 selectively receives a terrestrial digital broadcast signal. The terrestrial digital demodulator 112 demodulates the terrestrial digital broadcast signals. The TS decoder 113 decodes video data, audio data, program information, as well as additional information including text information or control data, from the demodulated stream signal. The video decoder 114 decodes video data and outputs a video signal. The audio decoder 115 decodes audio data and outputs an audio signal.

The image display component 2 includes a liquid crystal display device. The image display component 2 has the liquid crystal panel 21, the panel drive circuit 22, a backlight device 23, and the inverter circuit 24. The panel drive circuit 22 performs scaling according to the number of pixels of the liquid crystal panel 21 (the horizontal to vertical ratio; m:n) based on an RGB signal inputted from the video decoder 114, and produces image data equal to one screen as displayed on the liquid crystal panel 21. The image data thus produced is outputted to the liquid crystal panel 21. The backlight device 23 is disposed at the back of the liquid crystal panel 21. The backlight device 23 has a light source, such as a fluorescent lamp or the like, and emits light from the back of the liquid crystal panel 21. The inverter circuit 24 has a rectifier, a step-up transformer, or the like. The inverter circuit 24 converts DC voltage supplied from the power supply 13 into AC voltage of the desired high frequency, boosts the voltage, supplies the AC voltage to the light source of the backlight device 23, and lights the light source.

The control component 12 has a microprocessor (microcontroller) that performs overall control of the liquid crystal television set 1. The control component 12 is connected to a RAM (Random Access Memory) 15 that provides a working memory space, a nonvolatile memory 16 in which control programs and control data are stored, and so forth. The control panel 14 is provided with a plurality of control buttons and a remote control receiver 141. The control panel 14 receives operating instructions from the outside. As a result, the control component 12 issues control signals to the various components according to the various command signals inputted from a remote control R via the control panel 14 and the remote control receiver 141, so that the specified operations are carried out. The RAM 15 and the nonvolatile memory 16 can, of course, be integrated with the microprocessor. Also, the terrestrial digital broadcast signal can include various kinds of information as control data, such as the broadcast station name or other such information identifying the broadcast station, an affiliation ID indicating the affiliation of the broadcast station, or a remote control key ID indicating a channel number recommended for assignment by the broadcast station from among channel numbers 1 to 12. These data are decoded by the TS decoder 113 and sent to the control component 12.

The user operates, for example, the remote control R or the control panel 14 provided to the cabinet 4 and adjusts to the desired channel so as to be able to view the image displayed on the liquid crystal panel 21 of the image display component 2, and to be able to hear the sound outputted from the speaker devices 3 at the same time.

Figure 3:
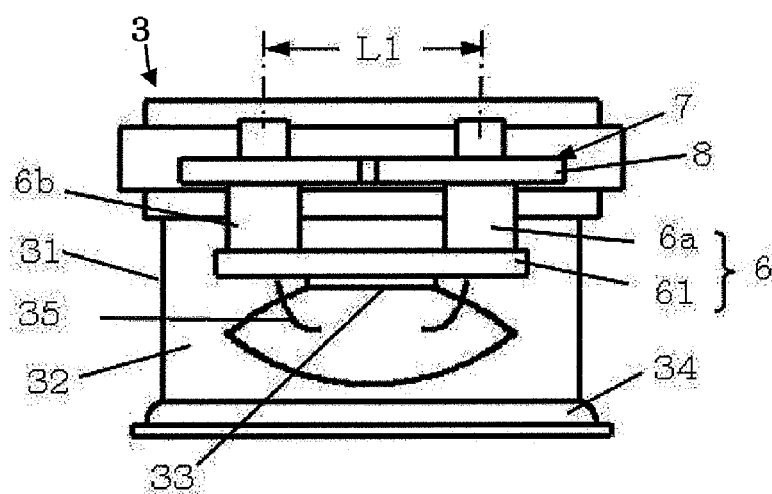
FIG. 3 is a side view of the speaker device of the television set illustrated in FIG. 1.
Figure 4:
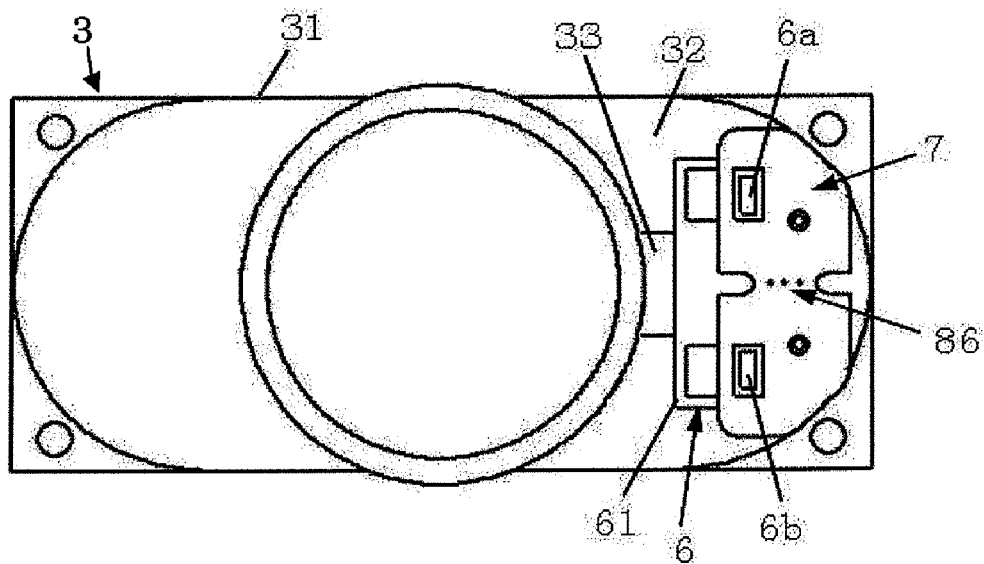
FIG. 4 is a rear view of the speaker device illustrated in FIG. 3.
Figure 5:
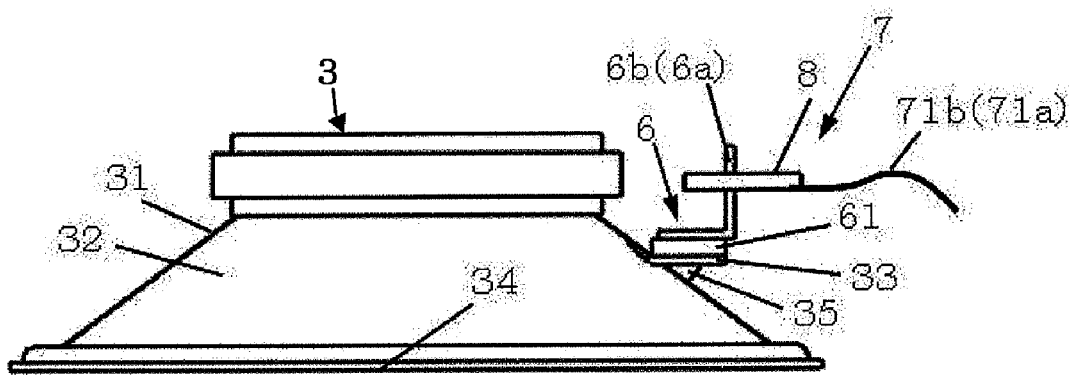
FIG. 5 is a top plan view of the speaker device illustrated in FIG. 3.

As shown in FIGS. 3 to 5, each of the speaker devices 3 has a speaker 31, an input terminal component 6 of the speaker 31, and a connecting component 7. The speaker 31 is a dynamic speaker, for example. The speaker 31 basically includes a frame, a diaphragm connected to the frame, a voice coil attached to the diaphragm and a magnet facing the voice coil. The drive system of the speaker 31 is well known in the speaker art, and conventional drive systems can be used as the drive system of the speaker 31. Thus, the detail descriptions of the speaker 31 may be omitted. Furthermore, the speaker 31 can includes other arrangement well known in the speaker art. The connecting component 7 electrically connects the input terminal component 6 of the speaker 31 to the main printed circuit board 5. The main printed circuit board 5 is equipped with a function that outputs an audio signal to the input terminal component 6, such as the television reception component 11. The speaker 31 has a main body frame 32, an attachment base 33 formed by bending down from the main body frame 32, an attachment flange 34, and so forth. In particular, the attachment base 33 extends from the main body frame 32.

Figure 6:
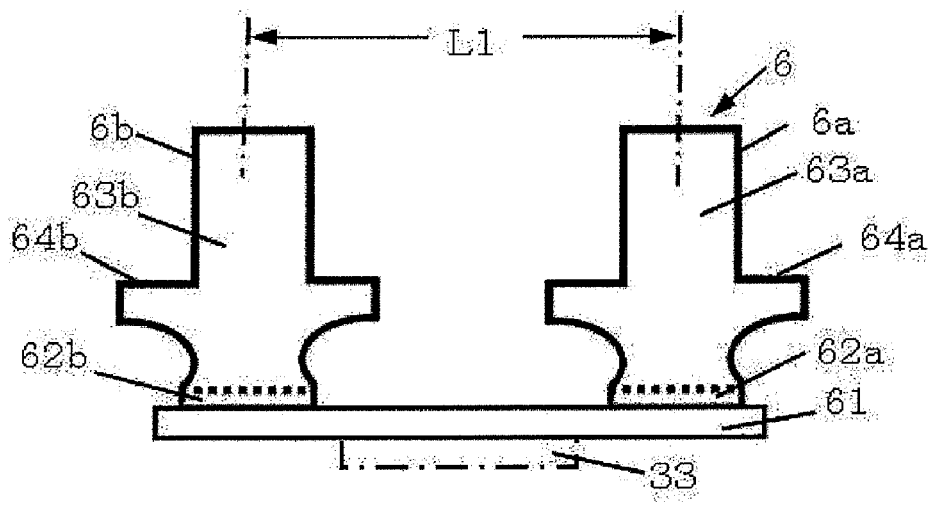
FIG. 6 is a front view of an input terminal component of the speaker device illustrated in FIG. 3.
Figure 7:
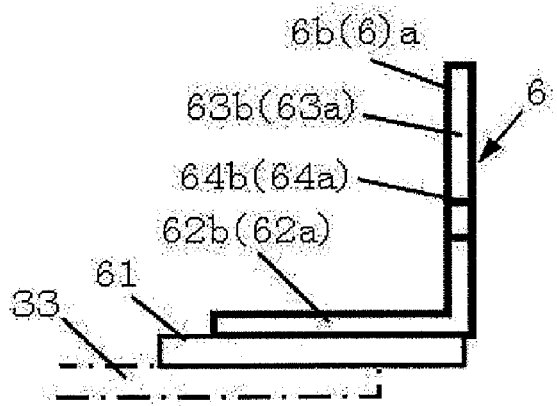
FIG. 7 is a side view of the input terminal component illustrated in FIG. 6.

As shown in FIGS. 6 and 7, the input terminal component 6 has a pair of input terminals 6a and 6b formed next to each other on an insulating plate 61. The input terminals 6a and 6b are disposed spaced apart with a pitch (e.g., first predetermined distance) L1 therebetween. The input terminals 6a and 6b has base components 62a and 62b, fitting components 63a and 63b, and flanges 64a and 64b, respectively. The base components 62a and 62b are affixed to the insulating plate 61 and formed by bending a sheet of electroconductive material into an L-shaped cross section. In other words, the base components 62a and 62b include L-shaped electroconductive parts, respectively. The fitting components 63a and 63b are fitted in terminal holes 82a and 82b made in a relay-use printed circuit board 8 of the connecting component 7 (discussed below). The flanges 64a and 64b are formed between the base components 62a and 62b and the fitting components 63a and 63b in the same plane as the fitting components 63a and 63b. The input terminal component 6 is formed by affixing the insulating plate 61 to the attachment base 33 formed by bending from the main body frame 32. The speaker 31 and the input terminal component 6 are electrically connected by lead wires 35.

Figure 8:
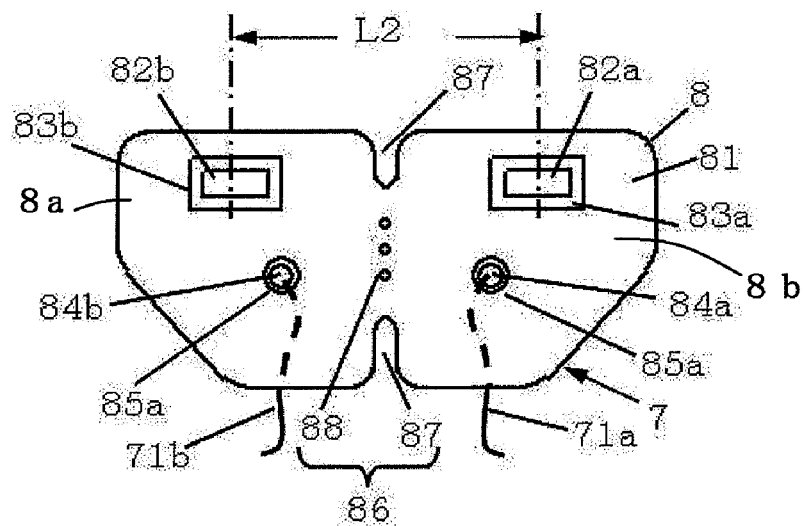
FIG. 8 is a top plan view of a relay-use printed circuit board of the speaker device illustrated in FIG. 3.
Figure 9:
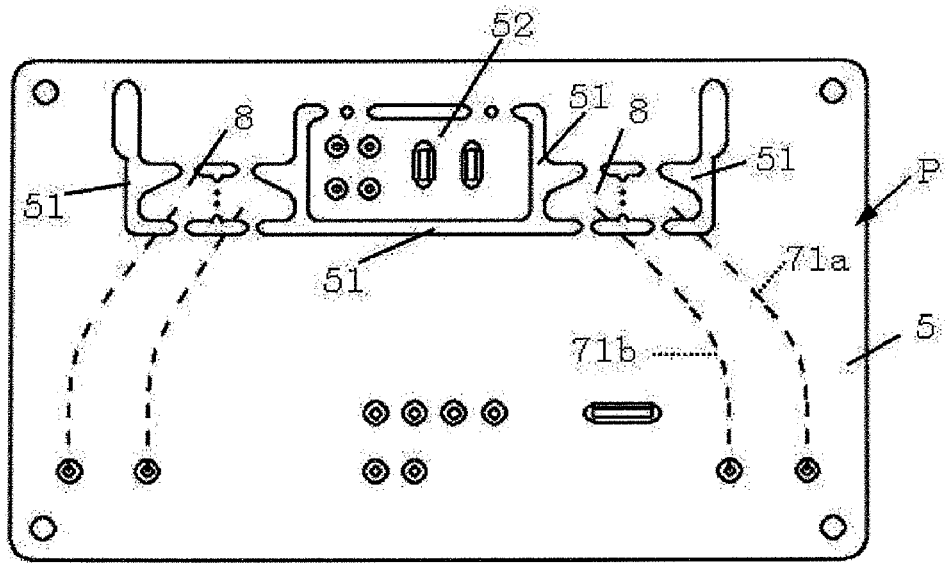
FIG. 9 is a top plan view of a printed board.
Figure 10:
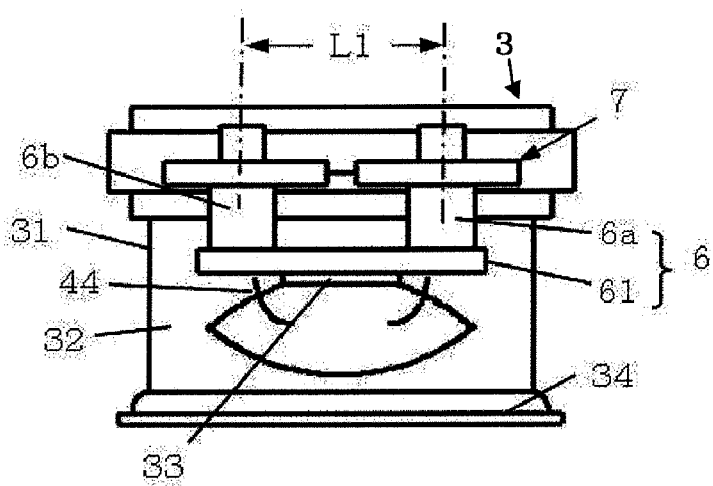
FIG. 10 is a side view of a speaker device having a different terminal pitch from the speaker device illustrated in FIG. 3.

As shown in FIGS. 8 and 9, the connecting component 7 has lead wires 71a and 71b and the relay-use printed circuit board 8. The lead wires 71a and 71b are electrically connected at one end to the main printed circuit board 5 equipped with the function that outputs the audio signal, such as the television reception component 11. The relay-use printed circuit board 8 is electrically connected to the other end of the lead wires 71a and 71b. The relay-use printed circuit board 8 is supported by the flanges 64a and 64b.

As shown in FIG. 8, the relay-use printed circuit board 8 has a board main body 81, a pair of terminal holes 82a and 82b, a pair of terminal lands 83a and 83b, a pair of lead wire holes 84a and 84b, a pair of lead wire lands 85a and 85b and a break away component (e.g., separation portion) 86. The board main body 81 includes a pair of sub-board portions 8a and 8b. The terminal holes 82a and 82b are formed on the sub-board portions 8a and 8b (e.g., left and right of the board main body 81), respectively, and in which parts of the input terminals 6a and 6b, namely, the fitting components 63a and 63b, are inserted. The terminal lands 83a and 83b are formed around the terminal holes 82a and 82b, respectively, to electrically couple the input terminals 6a and 6b to the sub-board portions 8a and 8b. The terminal holes 82a and 82b are disposed spaced apart with a pitch (e.g., second predetermined distance) L2 therebetween. The lead wire holes 84a and 84b is formed for inserting the lead wires 71a and 71b. The lead wire lands 85a and 85b are formed around the lead wire holes 84a and 84b, respectively. The break-away component 86 is disposed between the sub-board portions 8a and 8b to couple the sub-board portions 8a and 8b with the pitch L2 between the terminal holes 82a and 82b. In other words, the break-away component 86 couples the sub-board portions 8a and 8b to integrally form the relay-use printed circuit 8 as a one-piece, unitary member. The break-away component 86 allows the board main body 81 to be separated into left and right parts (e.g., the sub-board portions 8a and 8b). In particular, the break-away component 86 selectively separates the sub-board portions 8a and 8b when the pitch L1 is different from the pitch L2, for example. In FIG. 8, the break-away component 86 has a pair of upper and lower notched grooves 87 and perforations 88 provided in the middle portion. Although not depicted, the break-away component 86 can, of course, be formed by V grooves, U grooves, or other such cut-out grooves made on both sides of the board main body 81, or the notched grooves 87, the perforations 88, and cut-out grooves can be suitably used together.

As shown in FIG. 9, the relay-use printed circuit board 8 is formed via a dividing groove 51 in the dead space of the printed circuit collection board P having the main printed circuit board 5 with the function that outputs the audio signal, such as the television reception component 11. The printed circuit collection board P is formed as a one-piece, unitary member. The relay-use printed circuit board 8 of the connecting component 7 and the main printed circuit board 5 equipped with the function that outputs the audio signal are connected by the lead wires 71a and 71b ahead of time. At the time of assembly, the main printed circuit board 5 and the relay-use printed circuit board 8 are separated by the dividing groove 51. The dividing groove 51 can be formed by suitably combining a cut-out groove, perforations, a notched groove such as a V groove or a U groove, or the like. Also, a receiving printed circuit board 52 is formed in the dead space of the printed circuit collection board P. The remote control receiver 141 equipped with an infrared sensor or the like is mounted on the receiving printed circuit board 52. This allows the dead space of the printed circuit collection board P to be utilized more effectively, and cuts down on the amount of discarded board. The main printed circuit board 5, the relay-use printed circuit board 8, and the receiving printed circuit board 52 are not separated from the printed circuit collection board P until the time of assembly, and the various electronic parts are mounted in the state shown in FIG. 9. Also, electrical connections, such as the soldering of the lead wires 71a and 71b, is carried out at this time, and then the products are stored. As shown in FIG. 9, the printed circuit collection board P is equipped with two of the relay-use printed circuit boards 8 so that the left and right speaker devices 3 can include the relay-use printed circuit boards 8, respectively.

In the assembly process, the speaker 31 is installed in the cabinet 4. The fitting components 63a and 63b of the input terminals 6a and 6b are fitted into the terminal holes 82a and 82b of the relay-use printed circuit board 8. Here, if the pitch L1 between the input terminals 6a and 6b is substantially the same as the pitch L2 between the terminal holes 82a and 82b, and the terminal holes 82a and 82b is smoothly fitted into the input terminals 6a and 6b in this state, then the relay-use printed circuit board 8 is used in the state shown in FIG. 8, and is fitted and mounted in the fitting components 63a and 63b of the input terminals 6a and 6b in the state shown in FIG. 4. After this, the input terminals 6a and 6b and the terminal lands 83a and 83b are connected by soldering.

Figure 11:
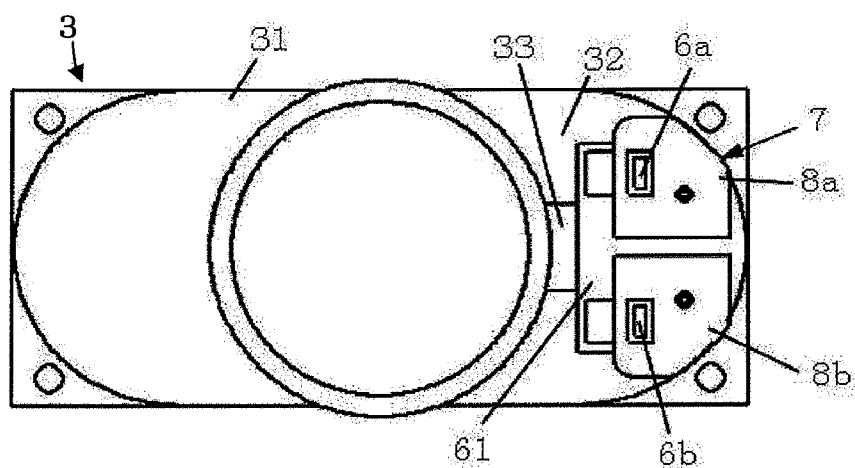
FIG. 11 is a rear view of the speaker device illustrated in FIG. 10.
Figure 12:
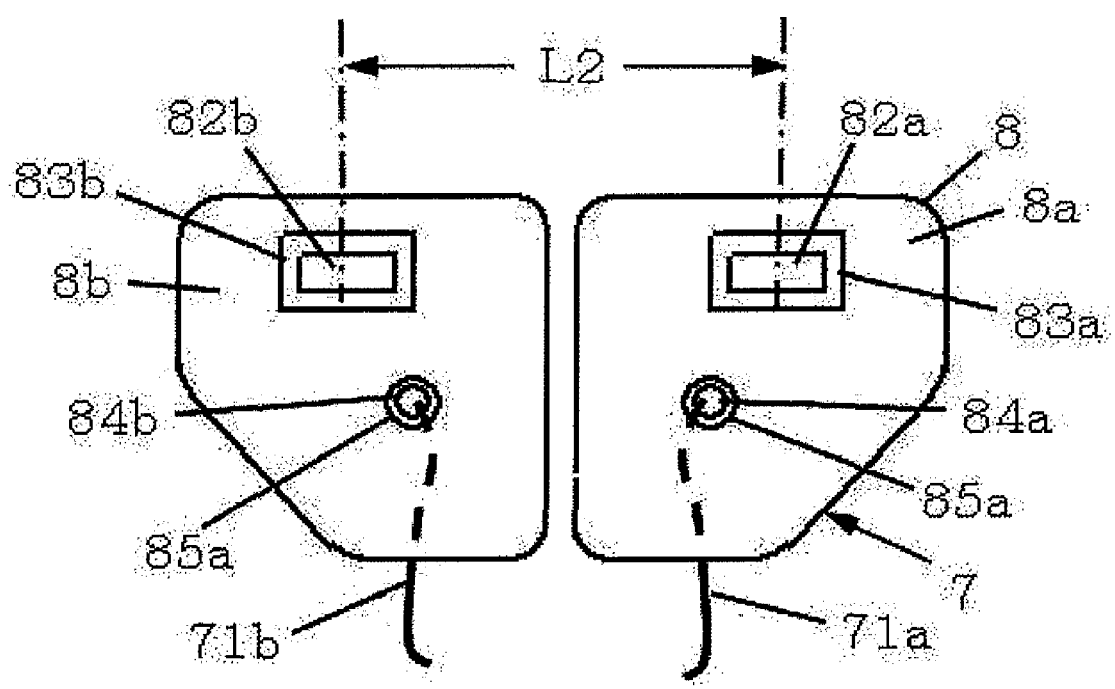
FIG. 12 is a top plan view of the relay-use printed circuit board used in a separated state.

If, on the other hand, the pitch L1 between the input terminals 6a and 6b is different from the pitch L2 between the terminal holes 82a and 82b because of a difference in the size of the speaker 31, etc., then as shown in FIG. 12, the board main body 81 is separated into the sub-board portions (e.g., separated relay-use printed circuit boards) 8a and 8b by the break-away component 86. After this, as shown in FIG. 11, the input terminals 6a and 6b are fitted and mounted in the terminal holes 82a and 82b of the sub-board portions 8a and 8b, respectively. After this, just as discussed above, the input terminals 6a and 6b and the terminal lands 83a and 83b are connected by soldering.

The relay-use printed circuit board 8 of the connecting component 7 for electrically connecting the input terminal component 6 of the speaker 31 and the main printed circuit board 5 equipped with the function that outputs the audio signal is provided with the break-away component 86 that allows the board main body 81 to be separated into left and right parts (e.g., the sub-board portions 8a and 8b). Therefore, during production of the input terminal component 6, if dimensional error (variance) in the pitch L1 between the side-by-side input terminals 6a and 6b occurs, or if a difference in the corresponding screen size or the like causes the sizes of the speaker 31 to be different, the pitch L1 between the input terminals 6a and 6b is not the same as the pitch L2 between the terminal holes 82a and 82b. When the connection is made, the board main body 81 can be broken off from the break-away component 86, and the relay-use printed circuit board 8 can be separated into left and right parts. Then, the fitting components 63a and 63b of the input terminals 6a and 6b can be fitted into the terminal holes 82a and 82b, and the speaker 31 can be connected to the main printed circuit board 5, all extremely easily and accurately, without using undue force. As a result, it is easier to connect the input terminal component 6 and the connecting component 7. Furthermore, because the connecting component 7 is shared, universality is improved.

Also, because the attachment base 33 is formed by bending the main body frame 32 in order to support the insulating plate 61 on which the input terminals 6a and 6b are provided, there is no need for an attachment base to be formed separately to support the insulating plate 61. As a result, the cost is reduced.

Also, the flanges 64a and 64b that are in the same plane as the fitting components 63a and 63b are formed between the base components 62a and 62b and the fitting components 63a and 63b. The fitting components 63a and 63b are fitted into the terminal holes 82a and 82b formed in a square shape. In this fitted state, the relay-use printed circuit board 8 is supported by the flanges 64a and 64b. Thus, the relay-use printed circuit board 8 and the input terminal component 6 can be connected securely and stably. Furthermore, the connection work is easier and more convenient.

Also, the relay-use printed circuit board 8 is formed in the dead space of the printed circuit collection board P including the printed circuit board 5 with the function that outputs the audio signal. The relay-use printed circuit board 8 of the connecting component 7 and the printed circuit board 5 with the function that outputs the audio signal are connected by the lead wires 71a and 71b ahead of time. Therefore, the relay-use printed circuit board 8 can be produced at the same time in the production of the printed circuit collection board P including the printed circuit board 5 with the function that outputs the audio signal, and the desired connections can be made ahead of time. As a result, the connecting component 7 takes less time to produce, and the printed circuit board 5 and the connecting component 7 can be integrally stored and managed up until the time of assembly.

Further, the break-away component 86 is provided on the relay-use printed circuit board 8 of the connecting component 7. Therefore, during production of the input terminal component 6, if dimensional error (variance) in the pitch L1 between the side-by-side input terminals 6a and 6b occurs, or if a difference in the corresponding screen size or the like should cause the sizes of the speaker 31 to be different, then the pitch L1 between the input terminals 6a and 6b is not the same as the pitch L2 between the terminal holes 82a and 82b. Thus, when the connection is made, the board main body 81 can be broken off from the break-away component 86, and the relay-use printed circuit board 8 can be separated into left and right parts. Therefore, part of the input terminals 6a and 6b can be fitted into the terminal holes 82a and 82b and the speaker 31 can be connected to the main printed circuit board 5, all extremely easily and accurately, without using undue force. As a result, it is easier to connect the input terminal component 6 and the connecting component 7. Furthermore, because the connecting component 7 is shared, universality is improved, which lowers the cost of this type of liquid crystal television set 1.

The speaker devices 3 are described as being used in the liquid crystal television set 1, but the speaker devices 3 can, of course, be applied to other flat-screen television sets or to audio speaker devices.

GENERAL INTERPRETATION OF TERMS

In understanding the scope of the present invention, the term "comprising" and its derivatives, as used herein, are intended to be open ended terms that specify the presence of the stated features, elements, components and groups, but do not exclude the presence of other unstated features, elements, components and groups. The foregoing also applies to words having similar meanings such as the terms, "including", "having" and their derivatives. Also, the terms "part," "section," "portion," "member" or "element" when used in the singular can have the dual meaning of a single part or a plurality of parts. As used herein to describe the present invention, the following directional terms "forward, rearward, above, downward, vertical, horizontal, below and transverse" as well as any other similar directional terms refer to those directions of a speaker device equipped with the present invention. Accordingly, these terms, as utilized to describe the present invention should be interpreted relative to a speaker device equipped with the present invention as used in the normal operating position.

While a preferred embodiment has been chosen to illustrate the present invention, it will be apparent to those skilled in the art from this disclosure that various changes and modifications can be made herein without departing from the scope of the invention as defined in the appended claims. Furthermore, the foregoing description of the preferred embodiment according to the present invention is provided for illustration only, and not for the purpose of limiting the invention as defined by the appended claims and their equivalents.

What is claimed is:

1. A speaker device comprising:
a speaker having a pair of input terminals spaced apart with a first predetermined distance therebetween; and
a connecting component electrically coupling the speaker to a printed circuit board that is configured to output an audio signal, the connecting component having a relay-use printed circuit board including
a pair of sub-board portions with a pair of terminal holes formed on the sub-board portions, respectively, with the input terminals of the speaker being disposed through the terminal holes, respectively, to electrically couple the input terminals to the sub-board portions, and
a separation portion disposed between the sub-board portions to couple the sub-board portions with a second predetermined distance between the terminal holes of the sub-board portions, and selectively separate the sub-board portions when the first predetermined distance between the input terminals of the speaker is different from the second predetermined distance between the terminal holes of the sub-board portions, and
a pair of lead wires electrically coupling the sub-board portions of the relay-use printed circuit board to the printed circuit board, respectively.

2. The speaker device according to claim 1, wherein each of the sub-board portions has a terminal land formed around the terminal hole of each of the sub-board portions to electrically couple the input terminals of the speaker to the sub-board portions, respectively.

3. The speaker device according to claim 1, wherein the speaker further has
a main body frame,
an attachment base that extends from the main body frame, and
an insulating plate that is fixedly attached to the attachment base and on which the input terminals are provided.

4. The speaker device according to claim 3, wherein each of the input terminals further has
a base component fixedly attached to the insulating plate and having an L-shaped electroconductive part,
a fitting component disposed through the terminal hole of respective one of the sub-board portions, and
a flange formed between the base component and the fitting component to support the respective one of the sub-board portions.

5. The speaker device according to claim 4, wherein each of the terminal holes is formed in a square shape.

6. The speaker device according to claim 1, wherein the relay-use printed circuit board of the connecting component and the printed circuit board are formed on a one-piece, unitary printed circuit collection board with a dividing groove therebetween, and are separated by the dividing groove after being connected with the lead wires.

7. The speaker device according to claim 1, wherein the separation portion couples the sub-board portions to integrally form the relay-use printed circuit as a one-piece, unitary member.

8. A television set comprising:
a printed circuit board with a television reception component that is configured to tune a broadcast signal of a channel set from among a plurality of broadcast signals received through an antenna, demodulate the broadcast signal of the channel, and output video and audio signals;
an image display component configured to display image based on the video signal outputted from the television reception component; and
a speaker device configured to output sound based on the audio signal outputted from the television reception component, the speaker device including
a speaker having a pair of input terminals spaced apart with a first predetermined distance therebetween, and
a connecting component electrically coupling the speaker to the printed circuit board, the connecting component having
a relay-use printed circuit board including
a pair of sub-board portions with a pair of terminal holes formed on the sub-board portions, respectively, with the input terminals of the speaker being disposed through the terminal holes, respectively, to electrically couple the input terminals to the sub-board portions, and
a separation portion disposed between the sub-board portions to couple the sub-board portions with a second predetermined distance between the terminal holes of the sub-board portions, and selectively separate the sub-board portions when the first predetermined distance between the input terminals of the speaker is different from the second predetermined distance between the terminal holes of the sub-board portions, and
a pair of lead wires electrically coupling the sub-board portions of the relay-use printed circuit board to the printed circuit board, respectively.

9. The television set according to claim 8, further comprising
a power supply;
a control component configured to control the television set; and
a cabinet housing the printed circuit board, the image display component, the speaker device, the power supply and the control component.

10. A relay-use printed circuit board for electrically coupling a speaker to a printed circuit board, the speaker having a pair of input terminals spaced apart with a first predetermined distance therebetween, the printed circuit board being configured to output an audio signal, the relay-use printed circuit board comprising:
a pair of sub-board portions electrically coupled to the printed circuit board with a pair of lead wires, respectively, the sub-board portions having a pair of terminal holes formed on the sub-board portions, respectively, with the input terminals of the speaker being disposed through the terminal holes, respectively, to electrically couple the input terminals to the sub-board portions; and
a separation portion disposed between the sub-board portions to couple the sub-board portions with a second predetermined distance between the terminal holes of the sub-board portions, and selectively separate the sub-board portions when the first predetermined distance between the input terminals of the speaker is different from the second predetermined distance between the terminal holes of the sub-board portions.

* * * * *